(12) United States Patent
Lin et al.

(10) Patent No.: US 7,355,282 B2
(45) Date of Patent: *Apr. 8, 2008

(54) POST PASSIVATION INTERCONNECTION PROCESS AND STRUCTURES

(75) Inventors: Mou-Shiung Lin, Hsin-Chu (TW); Chien-Kang Chou, Shin-Hwa Town (TW); Chiu-Ming Chou, Kao-Hsiung (TW)

(73) Assignee: Megica Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/970,871

(22) Filed: Oct. 22, 2004

(65) Prior Publication Data

US 2006/0049483 A1 Mar. 9, 2006

Related U.S. Application Data

(63) Continuation-in-part of application No. 10/937,543, filed on Sep. 9, 2004.

(51) Int. Cl.
*H01L 29/72* (2006.01)

(52) U.S. Cl. ............... 257/758; 257/359; 257/536; 257/537

(58) Field of Classification Search ........... 257/533, 257/758, 359, 536, 537
See application file for complete search history.

(56) References Cited

U.S. PATENT DOCUMENTS 5,055,907 A 10/1991 Jacobs .................. 357/71
5,106,461 A 4/1992 Volfson et al. ............ 205/125
5,212,403 A 5/1993 Nakanishi et al. ......... 257/664
5,372,967 A 12/1994 Sundaram et al. .......... 437/60
5,501,006 A 3/1996 Gehman, Jr. et al. ........ 29/840
5,576,680 A 11/1996 Ling ..................... 336/200
5,635,767 A 6/1997 Wenzel et al. ............ 257/778
5,686,764 A 11/1997 Fulcher ................. 527/778
5,884,990 A 3/1999 Burghartz et al. ......... 336/200
6,008,102 A 12/1999 Alford et al. ............. 438/381
6,303,423 B1 10/2001 Lin ........................ 438/238
6,383,916 B1 5/2002 Lin ........................ 438/637
6,495,442 B1 12/2002 Lin et al. ................ 438/618
7,087,927 B1 * 8/2006 Weaver et al. ............. 257/48

OTHER PUBLICATIONS

Co-pending U.S. Appl. No. 10/303,451, filed Nov. 25, 2002, Assigned to the Same Assignee.
Co-pending U.S. Appl. No. 10/445,558, filed May 27, 2003, Assigned to the Same Assignee.
Co-pending U.S. Appl. No. 10/445,559, filed May 27, 2003, Assigned to the Same Assignee.
Co-pending U.S. App., filed May 27, 2003, U.S. Appl. No. 10/455,560 Assigned to the Same Assignee.

* cited by examiner

*Primary Examiner*—Edward Wojciechowicz
(74) *Attorney, Agent, or Firm*—Saile Ackerman LLC; Stephen B. Ackerman; Rosemary L. S. Pike

(57) ABSTRACT

A system and method for forming post passivation metal structures is described. Metal interconnections and high quality electrical components, such as inductors, transformers, capacitors, or resistors are formed on a layer of passivation, or on a thick layer of polymer over a passivation layer.

36 Claims, 14 Drawing Sheets

US 7,355,282 B2

POST PASSIVATION INTERCONNECTION PROCESS AND STRUCTURES

This application is a continuation-in-part of MEG-04-013, Ser. No. 10/937,543, filed on Sep. 9, 2004.

RELATED PATENT APPLICATIONS

This application is related to MEG00-008CBBC, Ser. No. 10/303,451, filed on Nov. 25, 2002, MEG02-016, Ser. No. 10/445,558, filed on May 27, 2003, MEG02-017, Ser. No. 10/445,559, filed on May 27, 2003, and MEG02-018, Ser. No. 10/445,560, filed on May 27, 2003, all assigned to a common assignee, and all are herein incorporated by reference in their entirety.

BACKGROUND OF THE INVENTION

1. Field of the Invention

The invention relates to the manufacturing of high performance, high current, low power, and/or low voltage Integrated Circuit (IC's), and, more specifically, to methods of creating high performance, high current, low power, and/or low voltage electrical components on the surface of a semiconductor substrate.

2. Description of the Related Art

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the submicron range. The main components that offer a challenge in this respect are capacitors and inductors, since both these components are, for typical analog processing circuits, of considerable size.

When the dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Since the 1960's, sputtered aluminum has become a main stream IC interconnection metal material. The aluminum film is sputtered covering the whole wafer, and then the metal is patterned using photolithography methods and dry and/or wet etching. It is technically difficult and economically expensive to create thicker than 2 µm aluminum metal lines due to the cost and stress concerns of blanket sputtering. About 1995, damascene copper metal became an alternative for IC metal interconnection. In damascene copper, the insulator is patterned and copper metal lines are formed within the insulator openings by blanket electroplating copper and chemical mechanical polishing (CMP) to remove the unwanted copper. Electroplating the whole wafer with thick metal creates large stress and carries a very high material (metal) cost. Furthermore, the thickness of damascene copper is usually defined by the insulator thickness, typically chemical vapor deposited (CVD) oxides, which does not offer the desired thickness due to stress and cost concerns. Again it is also technically difficult and economically expensive to create thicker than 2 µm copper lines.

Current techniques for building an inductor on the surface of a semiconductor substrate use fine-line techniques whereby the inductor is created under a layer of passivation. The current fine-line techniques, either using sputtered aluminum or damascene copper, cannot provide inductors with a high quality factor due to the high resistance of fine-line metals. The resistance of the metal traces used to form the inductor coils will consume electrical energy. In addition, the fine-line techniques further imply close physical proximity between the created inductor and the surface of the substrate over which the inductor has been created (typically less than 10 µm), resulting in high electro-magnetic losses in the silicon substrate which in turn further results in reducing the Q value of the inductor.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.,) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/O traces.

U.S. Pat. No. 6,008,102 (Alford et al.) shows a helix inductor using two metal layers connected by vias.

U.S. Pat. No. 5,372,967 (Sundaram et al.) discloses a helix inductor.

U.S. Pat. No. 5,576,680 (Ling) and U.S. Pat. No. 5,884,990 (Burghartz et al.) show other helix inductor designs.

U.S. Pat. Nos. 6,495,442 to M. S. Lin et al and U.S. Pat. No. 6,383,916 to M. S. Lin, add, in a post passivation processing sequence, a thick layer of dielectric over a layer of passivation and layers of wide and thick metal lines on top of the thick layer of dielectric.

Co-pending U.S. patent application Ser. No. 10/445,558, 10/445,559, and 10/445,560 apply the post-passivation process of U.S. Pat. No. 6,383,916 in addition to creating high quality electrical components, such as an inductor, a capacitor or a resistor, on a layer of passivation or on the surface of a thick layer of dielectric.

SUMMARY OF THE INVENTION

It is the primary objective of the invention to improve the RF performance of High Performance Integrated Circuits.

Another objective of the invention is to provide a method for the creation of a high-Q inductor.

Another objective of the invention is to provide a method for the creation of high quality inductors, capacitors, or resistors in integrated circuits.

Yet another objective of the invention is to provide a method for mounting discrete electrical components on integrated circuits in a post-passivation process.

It is yet another objective of the invention to provide a method for fabricating post-passivation metal interconnections and devices having a much smaller RC product than that of the fine line metal interconnections under the passivation layer.

A further objective of the invention is to provide a method for fabricating post-passivation metal interconnections and devices having a structure different from the structure of the fine line metal interconnections underlying the passivation layer.

A still further objective of the invention is to provide a method for fabricating post-passivation metal interconnections and devices by a selective deposition process.

A still further objective is to provide post-passivation metal interconnection and device structures having a structure different from the structure of the fine line metal interconnections underlying the passivation layer.

Another objective is to provide post-passivation metal interconnection and device structures having a much smaller RC product than that of the fine line metal interconnections under the passivation layer.

In accordance with the objectives of the invention, a method of forming post-passivation interconnections and devices is achieved. A semiconductor substrate is provided. Fine line metal interconnection comprising one or more layers of metals overlying the semiconductor substrate is provided formed by a blanket metal deposition process and overlaid with a passivation layer, wherein the passivation layer comprises at least one passivation opening through which is exposed at least one top level metal contact point on the fine line metal interconnection. A post-passivation metal structure comprising one or more layers of metals formed over the passivation layer is formed by a selective metal deposition process and connected to at least one top level metal contact point wherein the at least one passivation opening is formed to a width larger than about 0.1 μm.

Also accordance with the objectives of the invention, a post-passivation metal interconnection and device structure is achieved. The post passivation system of the invention comprises a semiconductor substrate, fine line metal interconnection comprising one or more layers of metals overlying the semiconductor substrate, a passivation layer overlying the fine line metal interconnection, wherein the passivation layer comprises at least one passivation opening through which is exposed at least one top level metal contact point on the fine line metal interconnection, and a post-passivation metal structure comprising one or more layers of metals formed over the passivation layer and connected to at least one top level metal contact point wherein the passivation opening's width is larger than about 0.1 μm.

DESCRIPTION OF THE PREFERRED EMBODIMENTS

The post-passivation process, described in U.S. Pat. Nos. 6,383,916 and 6,495,442, to the same inventor as the current invention, teaches an Integrated Circuit structure where re-distribution and interconnect metal layers are created in layers of dielectric over the passivation layer of a conventional Integrated Circuit (IC). A layer of passivation is deposited over the IC, a thick layer of polymer is alternately deposited over the surface of the layer of passivation, and thick, wide metal lines are formed over the passivation.

U.S. Pat. No. 6,303,423 and the co-pending related patent applications, also assigned to a common assignee as the current invention, address, among other objectives, the creation of an inductor whereby the emphasis is on creating an inductor of high Q value above the passivation layer of a semiconductor substrate. The high quality of the inductor of the invention allows for the use of this inductor in high frequency applications while incurring minimum loss of power. The invention further addresses the creation of a capacitor and a resistor on the surface of a silicon substrate whereby the main objective (of the process of creating a capacitor and resistor) is to reduce parasitics that are typically incurred by these components in the underlying silicon substrate.

Figure 1:
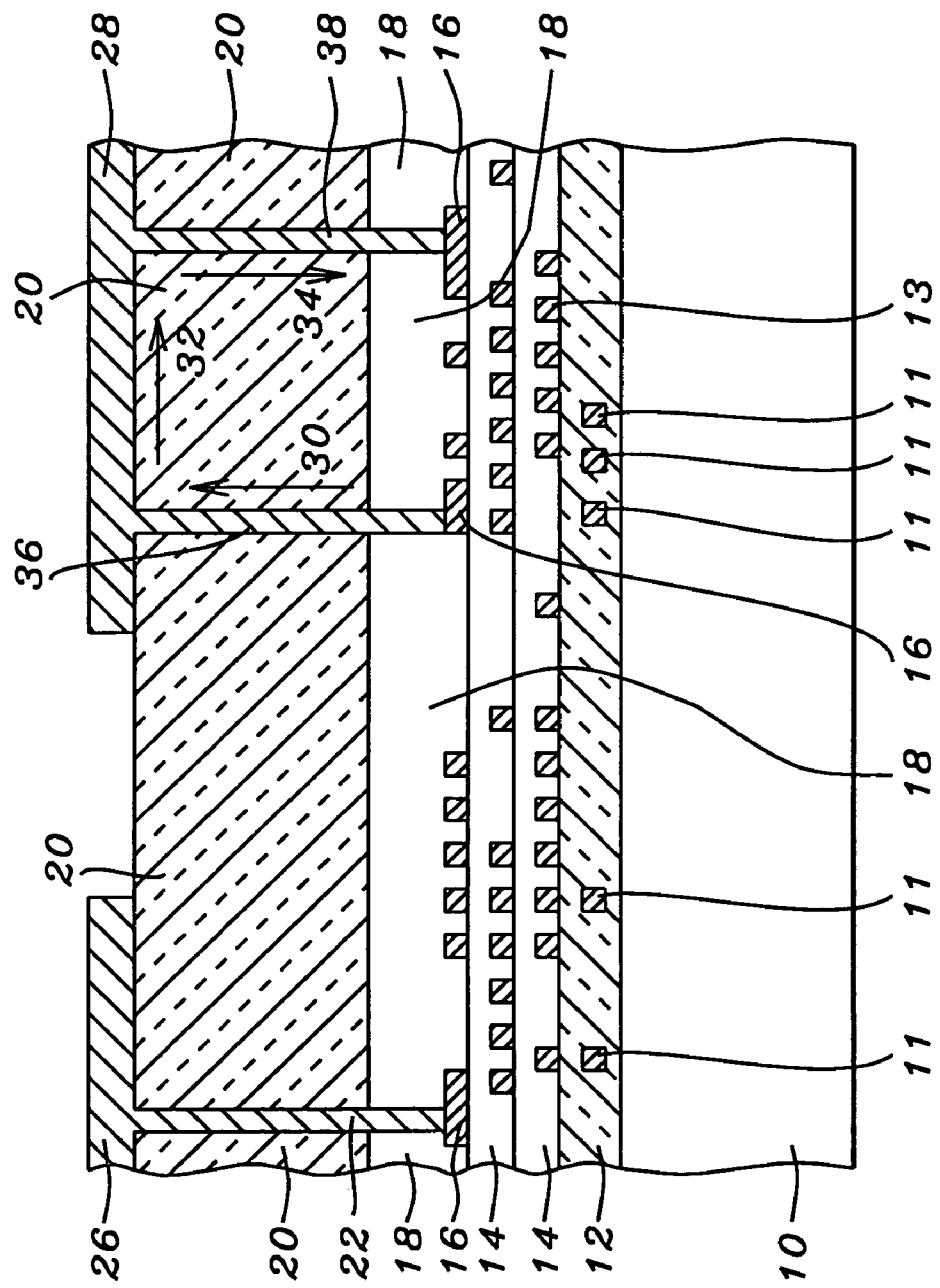
FIG. 1 is a cross sectional representation of the interconnection scheme shown in U.S. Pat. No. 6,383,916.

Referring now more specifically to FIG. 1, there is shown a cross section of one implementation of U.S. Pat. No. 6,383,916. The surface of silicon substrate 10 has been provided with transistors 11 and other devices (not shown in FIG. 1). The surface of substrate 10 is covered by an interlevel dielectric (ILD) layer 12, formed over the devices.

Layers 14 represent metal and dielectric layers that are typically created over ILD 12. Layers 14 contain one or more layers of dielectric, interspersed with one or more metal interconnect lines 13 that make up a network of electrical connections. At a top metal layer are points 16 of electrical contact. These points 16 of electrical contact can establish electrical interconnects to the transistors and other devices 11 that have been provided in and on the surface of the substrate 10. These metal layers 13 are referred to as fine line metal interconnections. Typically, the intermetal dielectric (IMD) layers 14 comprise silicon-based oxides, such as silicon dioxide formed by a chemical vapor deposition (CVD) process, CVD TEOS oxide, spin-on-glass (SOG), fluorosilicate glass (FSG), high density plasma CVD oxides, or a composite layer formed by a portion of this group of materials. The IMD layers 14 typically have a thickness of between about 1000 and 10,000 Angstroms. The fine line metal interconnections 13 are typically formed by sputtering aluminum or an aluminum alloy and patterning the aluminum to form the fine metal lines 13. Alternatively, the fine metal lines 13 may be formed by a copper damascene process. In the copper damascene process, the copper is protected by an adhesion/barrier layer not only underlying the copper, but also surrounding the copper at the sidewalls of the line through the IMD layers 14. These fine metal lines 13 typically have a thickness of between about 1000 and 10,000 Angstroms. In the fabrication process of the fine line metal interconnections 13, a typical clean room environment of class 10 or less is required; that is, having no more than 10 particles larger than 0.5 microns in any given cubic foot of air. The fine line IC metal is fabricated using 5X steppers or scanners or better and using a photoresist layer having thickness of less than 5 microns.

A passivation layer 18, formed of, for example, a composite layer of silicon oxide and silicon nitride, is deposited over the surface of layers 14, and functions to prevent the penetration of mobile ions (such as sodium ions), moisture, transition metal (such as gold, copper, silver), and other contamination. The passivation layer 18 is used to protect the underlying devices (such as transistors, polysilicon resistors, poly-to-poly capacitors, etc.) and the fine-line metal interconnection 13.

The key steps of U.S. Pat. No. 6,383,916, begin with the deposition of an optional thick layer 20 of polymer that is deposited over the surface of passivation layer 18. Access must be provided to points of electrical contact 16; for this reason, a pattern of openings 22, 36 and 38 is formed through the polymer layer 20 and the passivation layer 18. The pattern of openings 22, 36 and 38 aligns with the pattern of electrical contact points 16. Contact points 16 are, by means of the openings 22/36/38 that are created in the layer 20 of polymer, electrically extended to the surface of layer 20.

Layer 20 is a polymer, and is preferably polyimide. Polymer layer 20 may optionally be photosensitive. Examples of other polymers layer 20 that can be used include benzocyclobutene (BCB), parylene or epoxy-based material such as photoepoxy SU-8 (available from Sotec Microsystems, Renens, Switzerland).

After formation of openings 22/36/38, metallization is performed to create patterned thick, wide metal layers 26 and 28, and to connect to contact points 16. Metal line 26 and 28 can be of any design in width and thickness to accommodate specific circuit design requirements, which can be used for power distribution, or as a ground or signal bus. Furthermore, metal 26 may be connected off-chip through wire bonds or solder bumps.

Contact points 16 are located on top of a thin dielectric layers 14 (FIG. 1), and the pad size must be kept small to minimize capacitance with underlying metal layers. In addition, a large pad size will interfere with the routing capability of the layer of metal.

Layer 20 is a thick polymer dielectric layer (for example, polyimide) having a thickness in excess of 2 µm (after curing). The range of the polymer thickness can vary from 2 µm to 150 µm, dependent on electrical design requirements. For a thicker layer of polyimide, the polyimide film can be multiple coated and cured. The polymer layer 20 is formed by spin-on, printing, or laminating.

U.S. Pat. No. 6,383,916 B1 allows for the interconnection of circuit elements at various distances, over the path 30/32/34 shown in FIG. 1, using the thick, wide (as compared to the underlying "fine line" metallization in layers 14) metal of lines 28. Thick, wide metal lines 28 have smaller resistance and thicker dielectric layer 20 has smaller capacitance than the fine line metallization 14 and is also easier and more cost effective to manufacture.

In more detail, the clean room environment of the post-passivation metal process can be of a class 100 or more; that is, having 100 or more particles larger than 0.5 microns in any given cubic foot of air. During photolithography in the post-passivation metal process, aligners or 1×steppers are used with a photoresist having a thickness of greater than 5 microns. The thick, wide metal lines 26 and 28 have a thickness of between about 2 and 100 microns and a width larger than about 2 microns. The wide metal lines 26 and 28 can be very wide, as would be used for power and ground planes.

Figure 2:
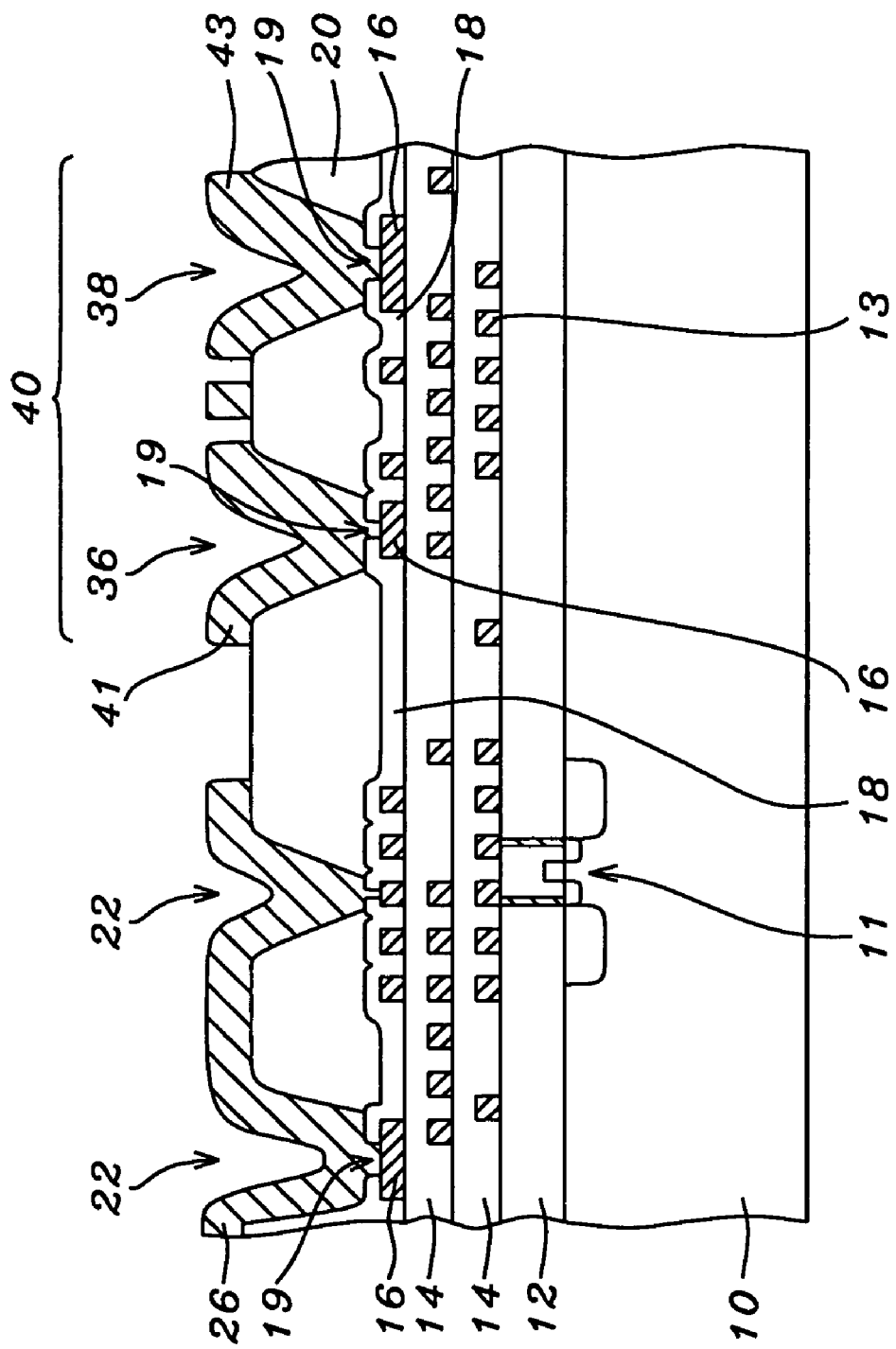
FIG. 2 is a cross sectional representation of an inductor of the invention, created on a thick layer of polyimide.

FIG. 2 shows how the interconnect aspect of U.S. Pat. No. 6,383,916, can be modified to form an inductor 40 on the surface of the thick layer 20 of polyimide. The inductor 40 is created in a plane that is parallel with the surface of the substrate 10 whereby this plane however is separated from the surface of the substrate 10 by the combined heights of dielectric layers 12, 14, 18, and 20. FIG. 2 shows a cross section of the inductor 40 taken in a plane that is perpendicular to the surface of substrate 10. The wide and thick metal of inductor 40 will also contribute to a reduction of the resistive energy losses. Furthermore, the low resistivity metal, such as gold, silver and copper, can be applied using electroplating; the thickness can be about 20 µm.

By increasing the distance between the inductor 40 and the semiconductor surface, as compared to prior art approaches in which the inductor is formed under the passivation layer 18, the electromagnetic field in the silicon substrate 10 will be reduced as the distance is increased, and the Q value of the inductor 40 can be increased. The inductor 40 overlies the layer 18 of passivation and by, in addition, creating the inductor 40 on the surface of a thick layer 20 of dielectric (such as a polymer) formed over the passivation layer 18. In addition, by using wide and thick metal for the creation of the inductor 40, the parasitic resistance is reduced.

In an important feature of the invention, the openings 19 in passivation layer 18 may be as small as 0.1 µm wide. Thus, contact pads 16 may also be nearly as small, which allows for greater routing capability in the top fine-line metallization layer 14, and lower capacitance.

In another important feature of the invention, the openings 22/36/38 in polymer 20 are larger than the passivation openings 19. The polymer openings 22/36/38 are aligned with passivation openings 19. The larger polymer openings 22/36/38 allow for relaxed design rules, simpler opening formation, and the use of a thick metal layer for the post-passivation metallization of the invention.

FIG. 2 illustrates interconnect structure 26 as well as inductor 40, wherein the inductor 40 includes two contacts 41 and 43, through polymer layer 20 to contact pads 16.

In another feature of the invention, the FIG. 2 structure may be covered by an additional layer of polymer (not shown).

Figure 3:
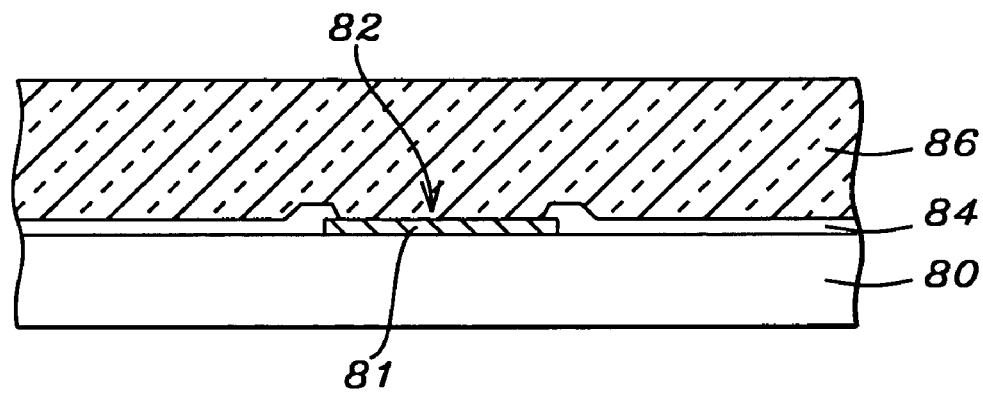
FIGS. 3-9 depict, in cross-sectional form, the creation of gold metal structures of the invention, through a layer of polymer.

Referring now to FIGS. 3-8, further details are provided for forming the post passivation inductor (and other passive devices) of the invention. In FIG. 3, a substrate 80 is shown, which could be an underlying dielectric layer, and a metal contact point 81, preferably comprising aluminum. A layer 84 of passivation has been patterned creating an opening 82 through layer 84 that exposes the contact pad 81. Layer 86 is a layer of polymer, preferably polyimide, as earlier described, deposited over the layer 84 of passivation, including the exposed surface of the contact pad 81. Polymer layer 86, such as polyimide, is typically spun on. For some thick layers 86 of polymer, the polymer layers 86 can be screen printed. Alternately, a laminated dry film polymer may be used.

Figure 4:
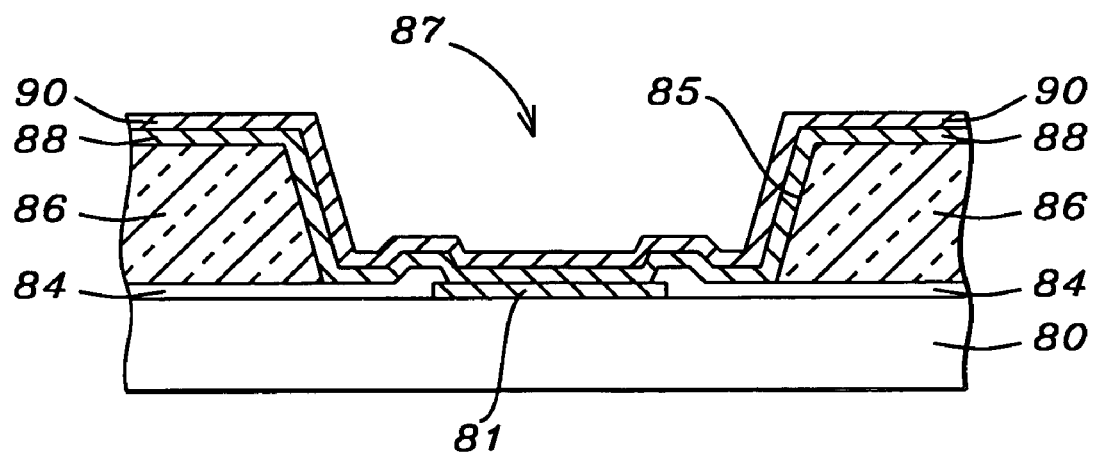

FIG. 4 illustrates forming an opening 87 in polymer 86, wherein the polymer opening 87 is larger than passivation opening 82. Opening 87 is depicted having sloped sides 85. Polymer layer 86 is exposed and developed to form opening 87, which initially has vertical sidewalls. However, the subsequent curing process causes the sidewalls to have a slope 85, and a opening 87 to have a resultant partially conical shape. The sidewall slope 85 may have an angle of 45 degrees or more, and is typically between about 50 and 60 degrees. It may be possible to form the sidewalls with an angle as small as 20 degrees.

By creating relatively large vias 87 through the layer 86 of polyimide or polymer, aligned with smaller vias 82 created through the underlying layer 84 of passivation, aligned with underlying sub-micron metal layer, it is clear that the sub-micron metal vias can effectively be enlarged when progressing from the sub-micron metal layer to the level of the thick, wide metal.

Continuing to refer to FIG. 4, one metallization system and selective deposition process for forming the post passivation interconnect and inductor of the invention is depicted. First, a glue/barrier layer 88, preferably comprising TiW, TiN, TaN, Ti, or Cr is deposited, preferably by sputtering to a thickness of between about 500 and 5,000 Angstroms. A gold seed layer 90, is next sputter deposited over the glue/barrier 88, to a thickness of between about 300 and 3,000 Angstroms.

Figure 5:
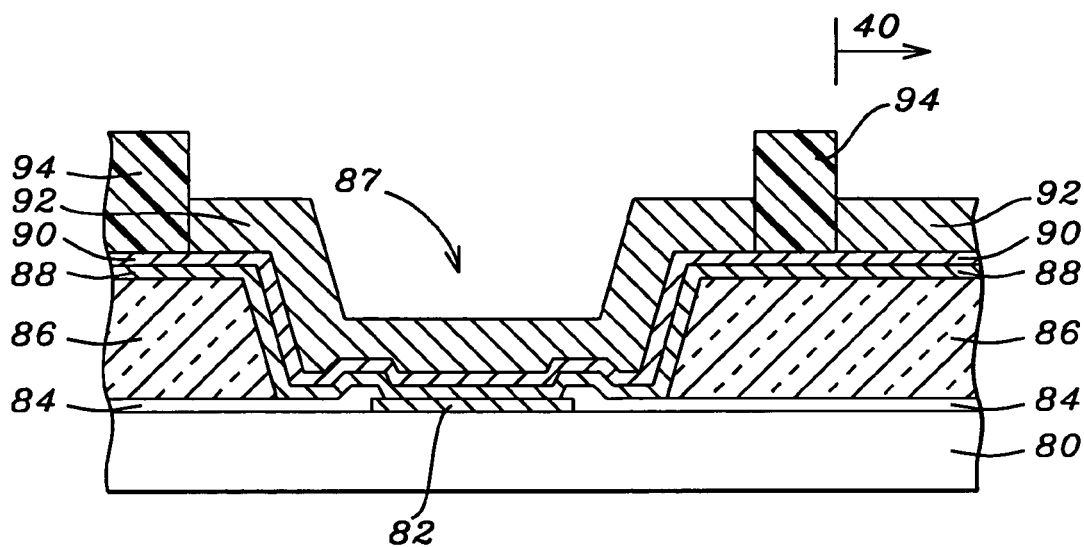

Referring now to FIG. 5, a bulk layer 92 of gold (Au) is next formed by electroplating, to a thickness of between about 1 and 20 µm. Electroplating is preceded by deposition of a thick photoresist 94 (to a thickness greater than the desired bulk metal thickness), and conventional lithography to expose the gold seed layer 90 in those areas where electroplating thick metallization is desired.

Thus, a selective deposition process forms the post-passivation metal structure. An advantage of the selective deposition process of the invention is a minimization of wasted material. In the selective deposition process, the metal is electroplated only where it is needed. In contrast, in the standard copper damascene process used for fine line metallization, copper is electroplated everywhere and then etched or polished away where it is not needed. Covering the whole wafer with thick copper creates stress which causes the process problem. This is a waste of copper. The removed copper is often contaminated and may not be able to be reused.

Furthermore, in the selective deposition process of the invention, the thickness of selective electroplated metal is defined by the thickness of photoresist, which can be formed as thick as 100 microns. In other words, it is feasible and cost-effective to form thick metal by selective electroplating. By contrast, it is technically difficult to form thick metal by a damascene copper process. A primary limitation to forming thick copper damascene lines is the thickness of the chemical vapor deposited (CVD) oxides which define the damascene copper thickness. CVD oxides cannot be thickly deposited due to stress concerns. It is also very expensive to deposit thick CVD oxides.

Figure 6:
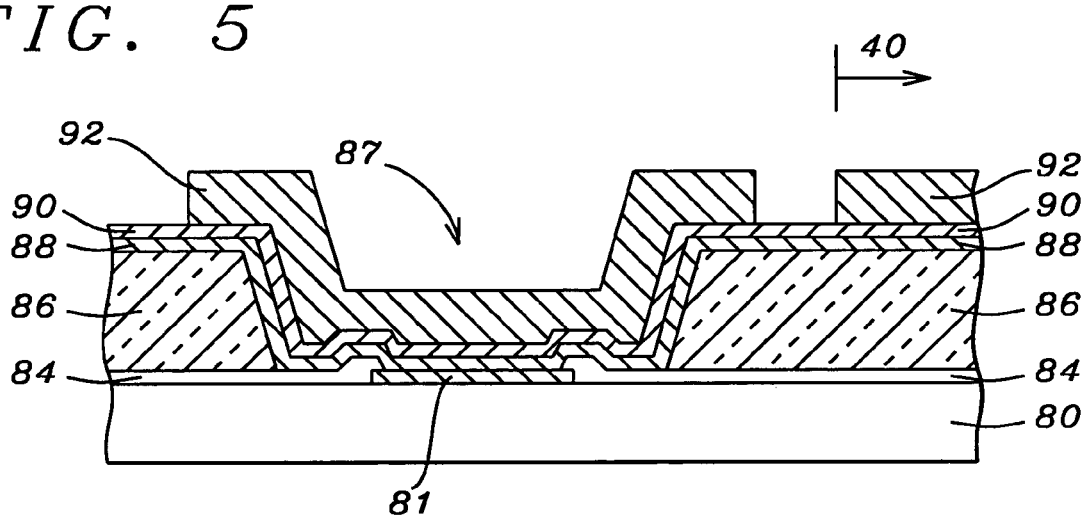
Figure 7:
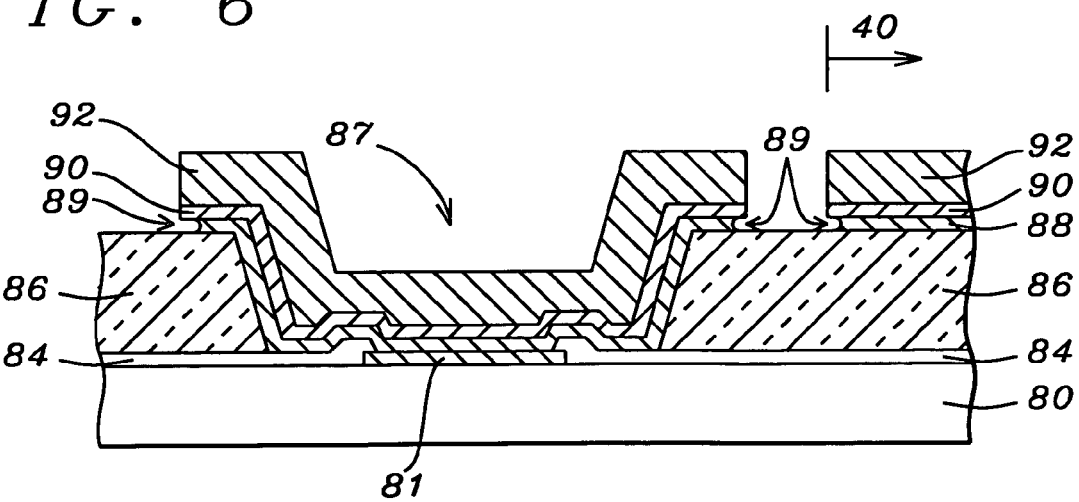

After electroplating, photoresist 94 is removed, as shown in FIG. 6. Glue/barrier Layer 88 and gold seed layer 90 are now removed, as shown in FIG. 7, by etching, using bulk Au layer 92 as a mask. During the self-aligned wet etching of the adhesion/barrier layer 88, an undercut 89 is formed in the adhesion/barrier layer 88 as shown in FIG. 7. The undercut 89 is usually between 0.1 to 1.0 micron per side, depending on etching recipe and over-etch time.

One coil of inductor 40 (the bulk layer 92 shown in FIG. 7) is shown, but it would be understood that the complete inductor would be formed at the same time.

The structure of the post-passivation metal interconnect and device, such as the inductor coil 40 shown, is different from the structure of the fine line metallization. In addition to the undercut 89 in the adhesion/barrier layer 88 there is a clear boundary between the sputtered thin gold seed layer 90 and the electroplated thick gold bulk layer 92. This can be seen, for example, in a transmission electron microscope (TEM) image. The boundary is due to different grain sizes and/or grain orientation in the two gold layers 90 and 92. For example, in a 1,000 Angstroms thick sputtered gold seed layer 90 under a 4 microns thick electroplated gold bulk layer 92, the grain size of the sputtered gold seed layer 90 is about 1,000 Angstroms, and the grain boundary is perpendicular to the surface of substrate. The grain size of the electroplated gold bulk 92 is greater than 2 microns with the grain boundary not perpendicular, and typically, at an angle of about 45 degrees from the substrate surface. In the fine line metal interconnections, there is no undercutting or clear boundary of grain size difference inside the aluminum layer.

Figure 8:
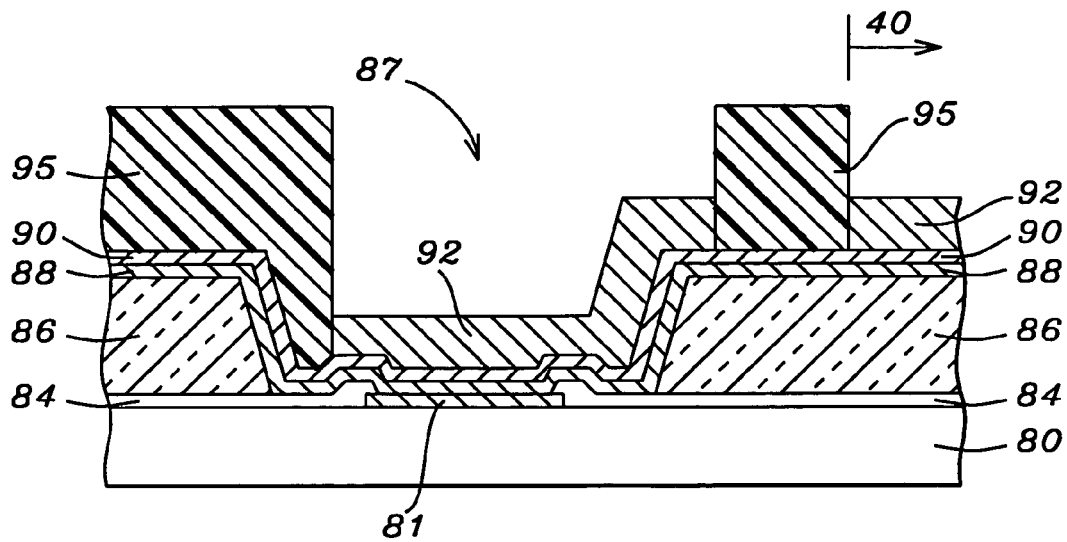
Figure 9:
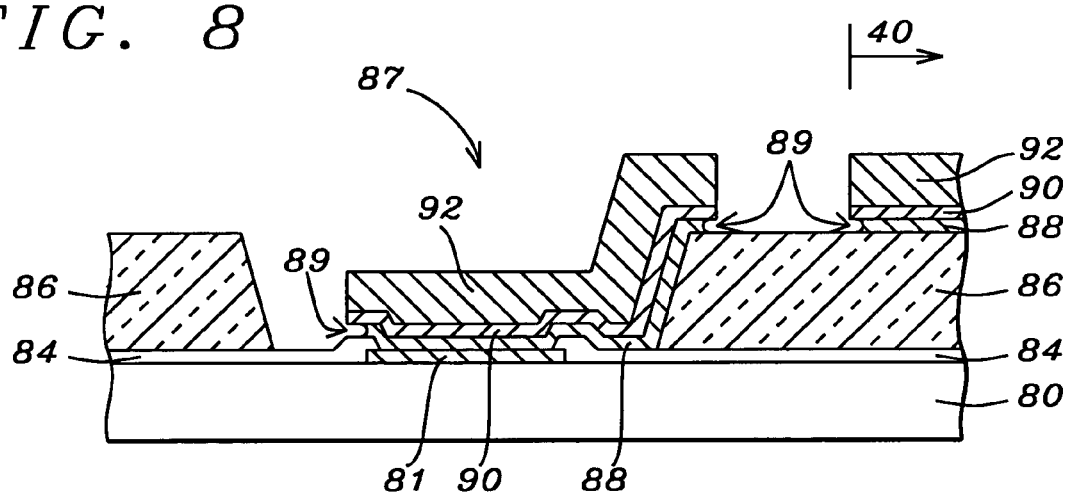

In another feature of the invention, polymer opening 87 may be only partially filled, as shown in FIGS. 8-9, which provides tight design rules for fine-pitch inductors. The design rule of polymer opening 87 is typically about 15 µm, while the metal traces 92 of inductor are as tight as a 4 µm pitch. Therefore, patterning metal layer 92 inside the polyimide opening 87 is a very important feature of this technology.

Glue/barrier layer 88 and Au seed layer 90 are sputtered as previously described, and photoresist 95 formed as shown in FIG. 8, followed by electroplating gold bulk layer 92. Photoresist 95 is then stripped, and the seed layer 90 and glue/barrier layer 88 etched as previously described, and as shown in FIG. 9.

Figure 10:
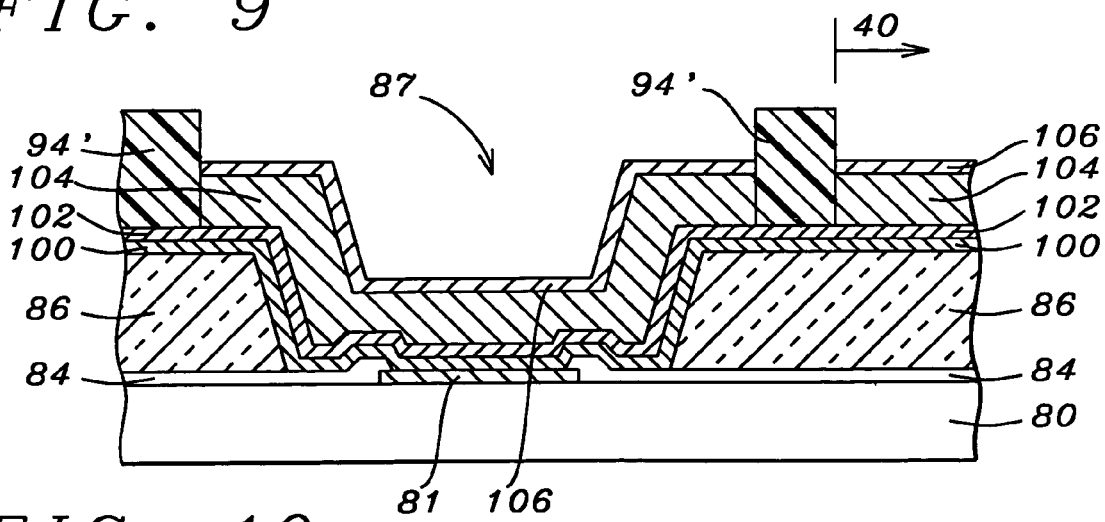
FIGS. 10-14 depict the creation of copper metal structures of the invention, through a layer of polymer.

In another embodiment of the invention, copper may be used as the bulk metal 92 in the post-passivation metallization scheme. The FIG. 4 structure is a starting point. Next, as shown in FIG. 10, a glue/barrier layer 100 of TiW, TiN, TaN, Cr, or Ti is sputter deposited to a thickness of between about 200 and 2000 Angstroms. Next, a Cu seed layer 102 is sputter deposited to a thickness of between about 2,000 and 10,000 Angstroms. Bulk layer 104 of Cu is next electroplated to a thickness of between about 3 and 20 μm, also using a photoresist 94' and conventional lithography to define the areas to be electroplated in the selective deposition process of the invention. Finally, an optional cap layer 106 comprising Ni may also be formed, also by electroplating, to a thickness of between about 0.1 and 3 μm.

Figure 11:
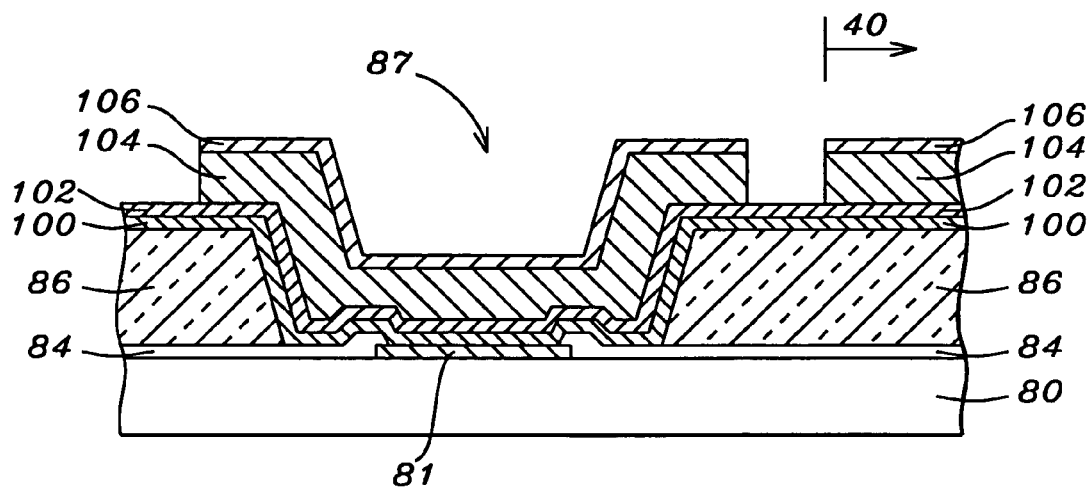
Figure 12:
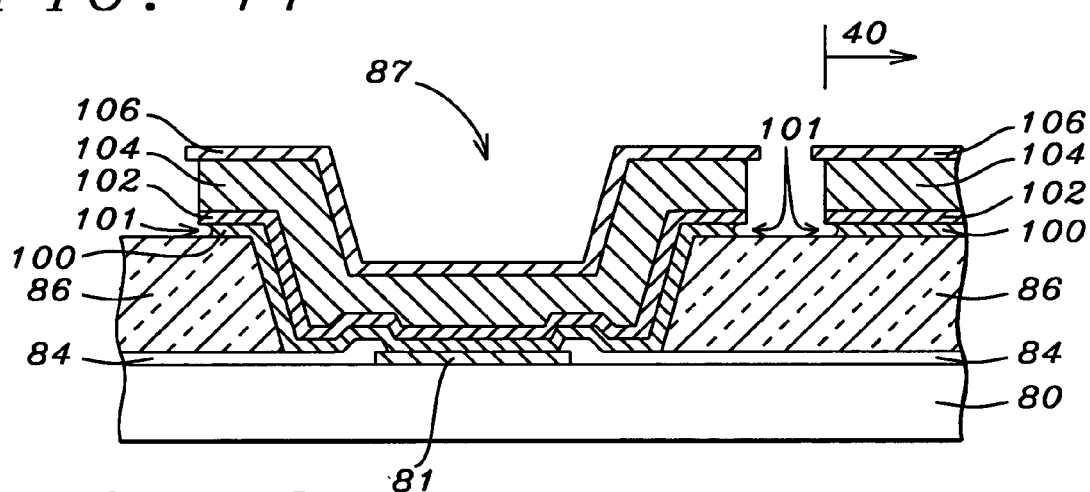

Referring to FIG. 11, photoresist 94' is stripped, exposing Cu seed layer 102. Glue/barrier layer 100 and Cu seed layer 102 are now removed, as shown in FIG. 12, by etching. The bulk Cu layer 104 is used as a mask for the etch. In this case, there is an undercut 101 at the edge of the glue/barrier layer 100 (Cr or Ti layer).

If the optional Ni cap layer 106 is used, it acts as an etch stop during the etching of glue/barrier 100 and seed layer 102. With the Ni cap layer 106, a faster Cu etch recipe can be used for removing the seed layer 102 since there is no loss of Cu bulk 104 in this configuration. In this case, there is an undercut 101 in the bulk copper layer 104 and seed copper layer 102, in addition to the undercut in the glue/barrier layer 100. In other words, there is an overhang of the Ni cap layer 106 at the edge of the bulk copper layer 104 and seed copper layer 102.

One coil of inductor 40 (the bulk layer 104 and cap layer 106 shown in FIG. 12) is shown, but it would be understood that the complete inductor 40 would be formed at the same time.

As described above, an undercut 101 in the adhesion/barrier layer 100 is formed during etching of that layer in the post-passivation metal process. Additionally, the adhesion/barrier layer 100 in the post-passivation metal structure is formed only under the copper line, as shown in FIG. 12. In the copper damascene process of the fine line metallization, an adhesion/barrier layer 100 is needed not only at the bottom, but also at the sidewalls of the copper line. This is needed primarily to protect the underlying active devices from copper ions. However, in the post-passivation scheme of the invention, the passivation layer 84 provides the barrier to copper ions.

Figure 13:
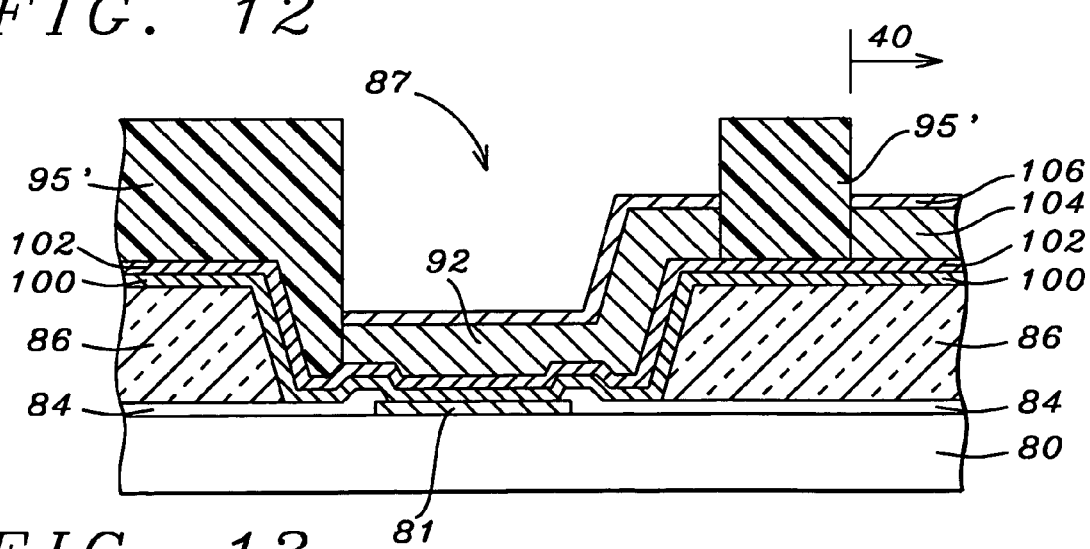
Figure 14:
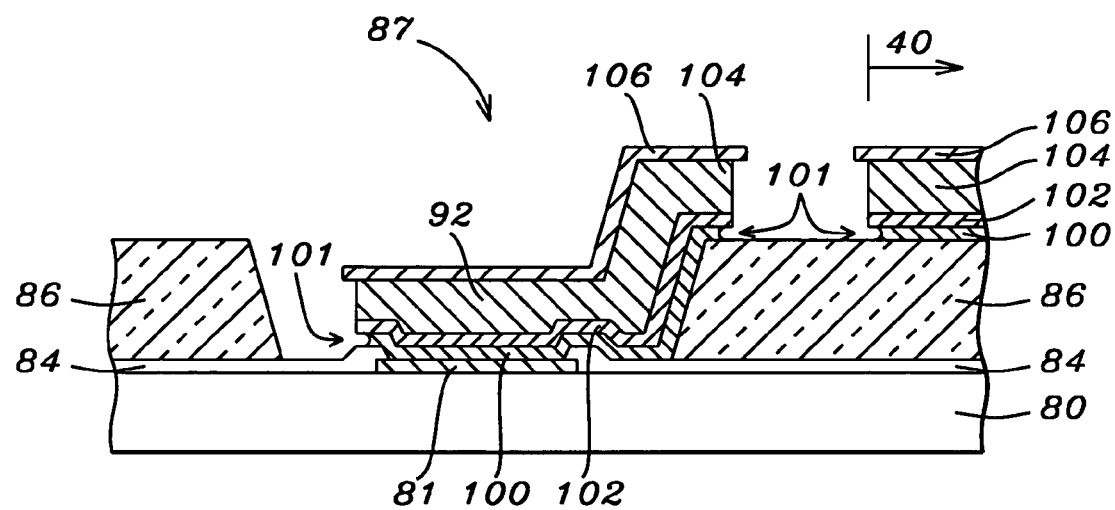

In another feature of the invention and as earlier described, polymer opening 87 may be only partially filled, as shown in FIGS. 13-14. Glue/barrier layer 100 and Cu seed layer 102 are sputtered as previously described, and photoresist 95' formed as shown in FIG. 13, followed by electroplating Cu bulk layer 104 and Ni cap layer 106. Photoresist 95' is then stripped, and the seed layer 102 and glue/barrier layer 100 etched as previously described, and as shown in FIG. 14.

Figure 15:
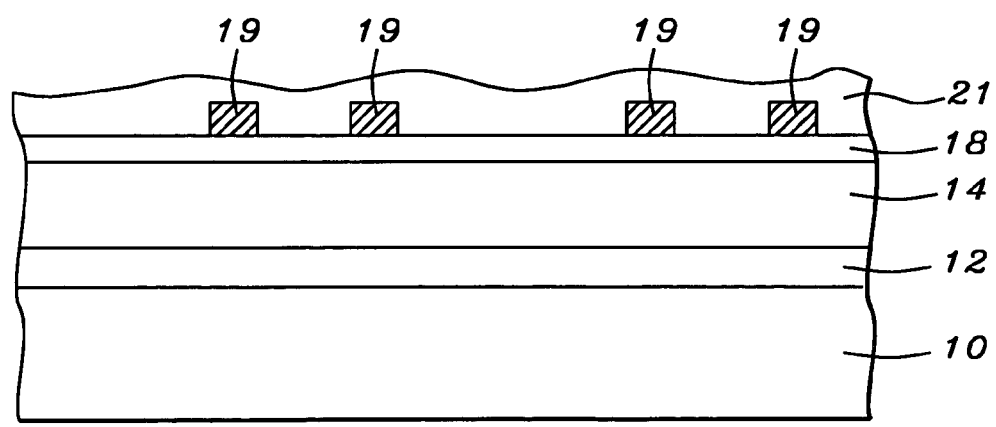
FIG. 15 shows an inductor of the invention above a layer of passivation.

Referring now to FIG. 15, layers similar to earlier descriptions are shown whereby in this case no layer of polyimide has been deposited over the layer 18 of passivation. An inductor 19 has been created on the surface of layer 18 of passivation. The ohmic resistivity of the metal that is used for inductor 19 must be as low as possible. For this reason, the use of a thick layer of, for instance, gold is preferred for the formation of inductor 19. It has been shown that a thick layer of gold increased the Q value of inductor 19 from about 5 to about 20 for 2.4 GHz applications.

The FIG. 15 inductor 19 may be connected to other elements in various configurations, as earlier described and as shown in the related patent applications.

An additional layer of polymer 21 may optionally be formed over inductor 19.

Figure 16A:
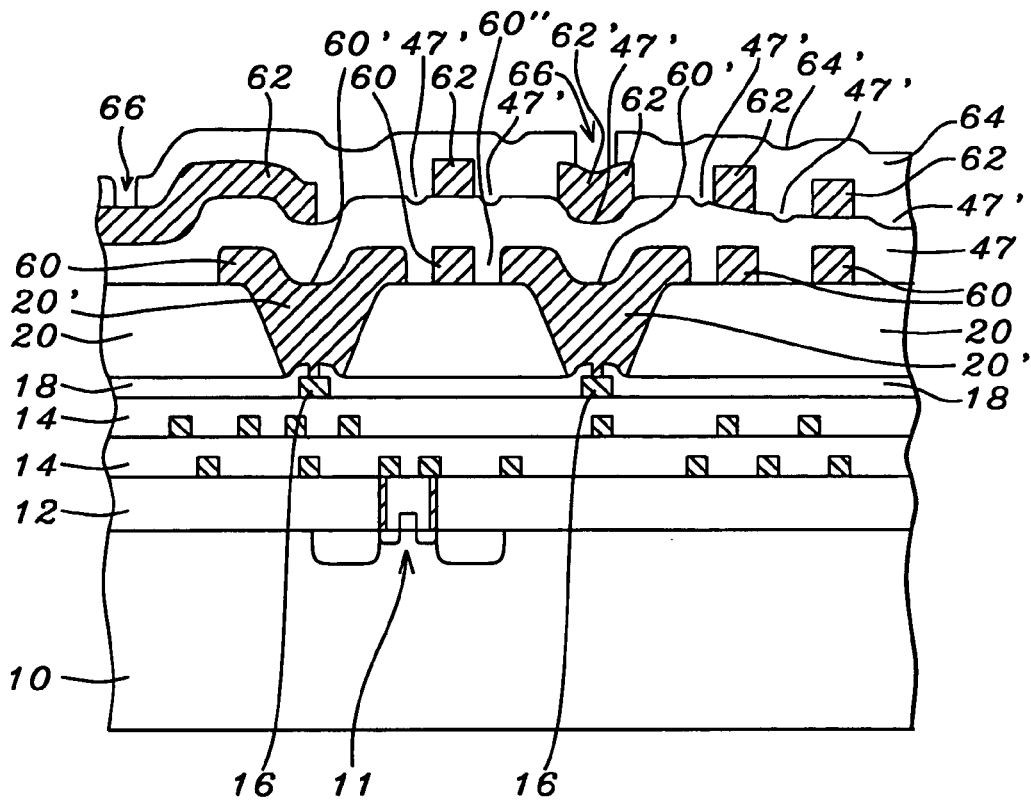
FIG. 16a is a cross sectional representation of a transformer according to the invention, formed over a polymer layer, over a layer of passivation.
Figure 16B:
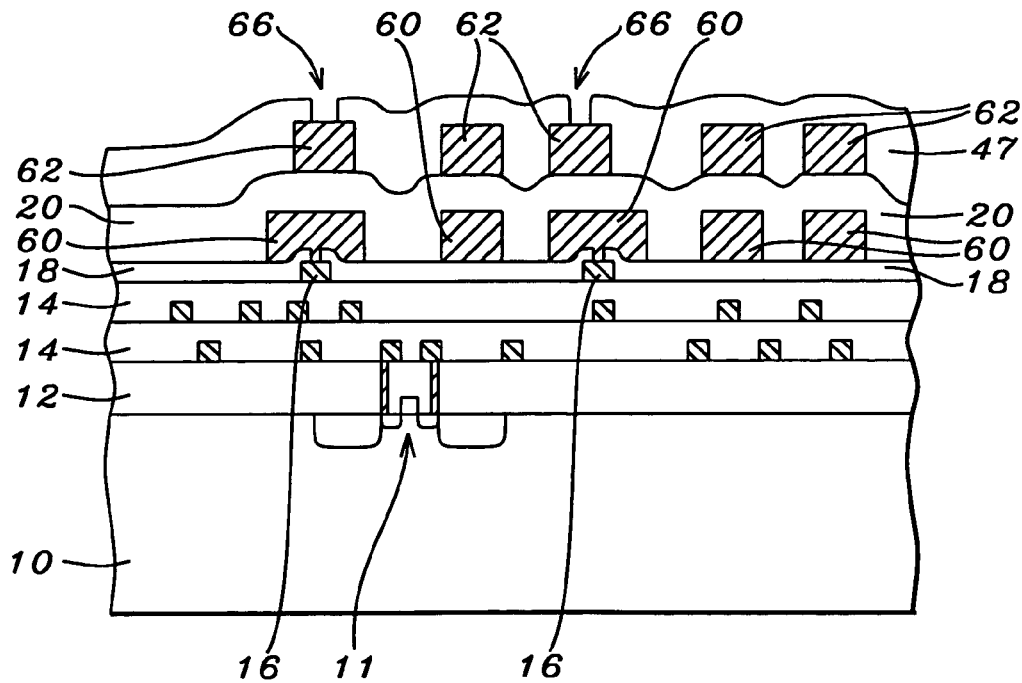
FIG. 16b is a cross sectional representation of a transformer according to the invention, with the bottom coil formed on a layer of passivation.

FIGS. 16a-16b depict a transformer made according to the invention. The transformer consists of bottom coil 60, and top coil 62, isolated by a dielectric layer 47. Polymer layers 20, 47 and 64 are formed, and comprise materials, previously described. Openings 66 are provided in top polymer layer 64 for connections to the top coil 62. The connections to the external circuits can be made through wirebonds, solder bumps, or gold bumps.

FIG. 16b is a cross-sectional representation of a transformer of the invention, in which the bottom coil 60 is formed directly on passivation layer 18. Solenoid and toroidal inductors may be fabricated in the same way, as described in related patent applications MEG02-016, Ser. No. 10/445,558, filed on May 27, 2003, MEG02-017, Ser. No. 10/445,559, filed on May 27, 2003, and MEG02-018, Ser. No. 10/445,560, filed on May 27, 2003, herein incorporated by reference in their entirety.

Since polymer, for example polyimide, cannot perfectly planarize underlying steps, gaps, or dips, there are concerns in the subsequent processes. In the post-passivation process, the thick metal creates big steps and gaps, and the thick polymer dielectric in addition generates deep openings. In FIG. 16a, openings 20' in the polymer insulating layer 20 results in dips 60' at the surface of the first post-passivation metal layer 60. In addition to the dips 60', there are metal gaps 60" between two pieces of the first metal 60. The dips 60' and gap 60" further result in dips 47' at the surface of the first intermetal polymer layer 47, dips 62' at the surface of the second metal layer 62, and dips 64' at the surface of the top polymer layer 64.

Figure 16C:
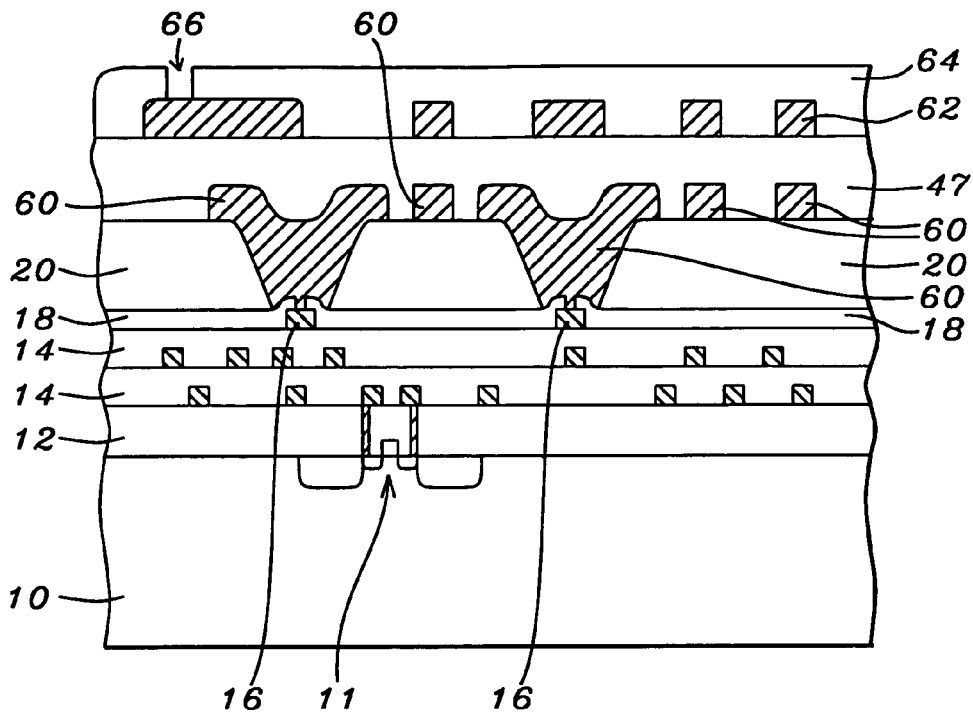
FIGS. 16c-16d show the transformers of FIGS. 16a and 16b, respectively, where the polymer layer is planarized.
Figure 16D:
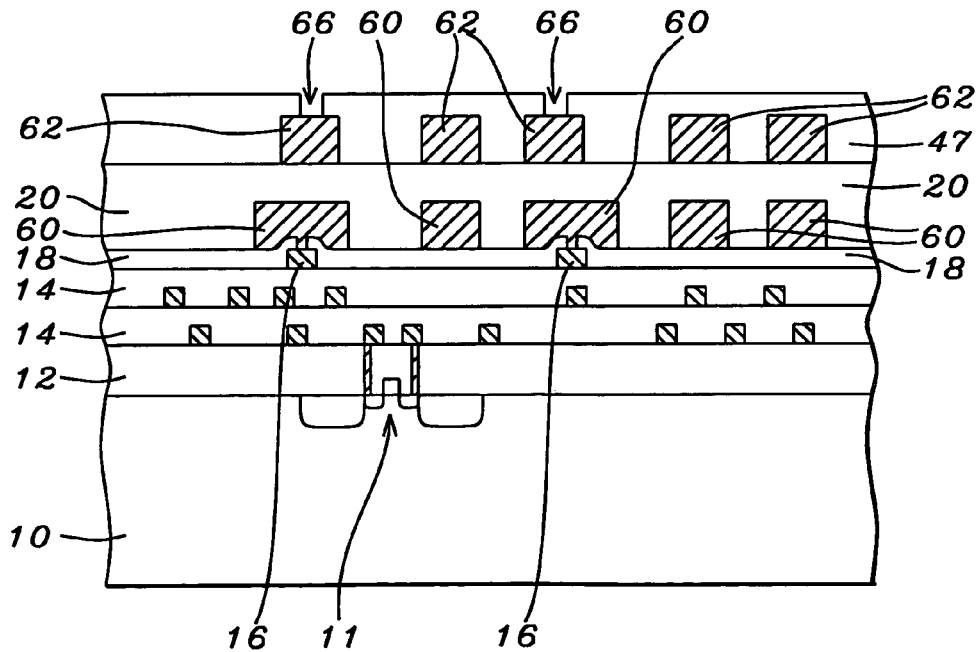

For multi-layers of metals in the post-passivation structure, additional planarization may be required on the polymer layer to create a flat surface for the subsequent processes. The layer of polymer 47 in FIG. 16a, and the layer of polymer 20 in FIG. 16b may require an additional planarization process. In FIG. 16c, the first intermetal polymer layer 47 and the cap polymer layer 64 are planarized, for example, by chemical-mechanical polishing (CMP). Dips 47' at the surface of the first intermetal polymer layer 47, dips 62' at the surface of the second metal layer 62, and dips 64' at the surface of the top polymer layer 64, all shown in FIG. 16a, do not appear in FIG. 16c using the CMP process. The polymer layers can be planarized immediately after depositing each intermetal polymer layer or before forming each layer 18 of post-passivation metallization and after forming openings in the intermetal polymer layer. Similarly, FIG. 16d shows the structure of FIG. 16b, but with planarization of the polymer layers 20 and 47.

Besides inductors, it is very useful to form other passive devices, such as capacitors and resistors, using the method and structure of the invention.

Figure 17A:
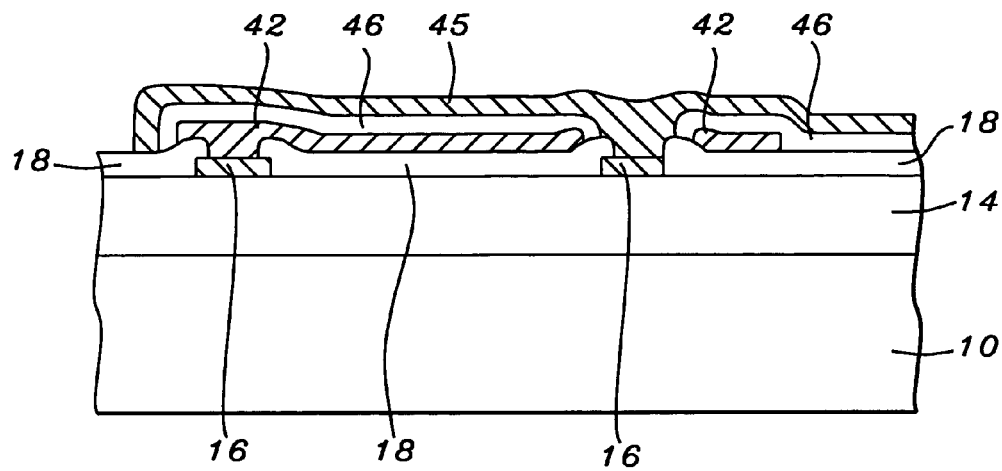
FIGS. 17a-17c are cross sectional representations of a capacitor of the invention, formed over a polymer layer over passivation.

FIG. 17a is a cross section of a capacitor that has been created over a substrate 10. A layer (or layers) 14 of fine line conductive interconnect lines and contact points 16 have been created over substrate 10. A layer 18 of passivation has been deposited over layer 14, with openings created in layer 18 of passivation through which contact pads 16 can be accessed.

A capacitor contains, as is well known, a lower plate, an upper plate and a layer of dielectric that separates the upper plate from the lower plate. FIG. 17a includes lower plate 42, upper plate 45, and dielectric layer 46. The upper plates 45 and lower plates 42 are formed as earlier described, using electroplated Au or Cu for the bulk metals. An optional protective polymer (not shown), preferably polyimide, may be formed over the capacitor. Contacts to the capacitor may be made as described in the related patent applications for inductor terminals (both down, one up and one down, or both up).

Lower plate 42 is formed to a thickness of between about 0.5 and 20 μm. Layer 46 of dielectric is between about 500 and 50,000 Angstroms. Upper plate 45 is between about 0.5 and 20 μm thick.

The post-passivation capacitor shown in cross section in FIG. 17a has:
- reduced parasitic capacitance between the capacitor and the underlying silicon substrate 10
- allowed for the use of a thick layer of conductive material for the capacitor plates, reducing the resistance of the capacitor; this is particularly important for wireless applications
- can use high-dielectric-constant material in addition to a polymer, such as TiO2 or Ta2O5, Si3N4 or SiO2, for the dielectric layer 46 between the upper elate 45 and the lower plate 42 of the capacitor, resulting in a higher capacitive value of the capacitor.

The capacitor of FIG. 17a may alternately be formed above a polymer layer (deposited over passivation 18), similar to the transformer of FIG. 16a.

Dielectric layer 46 is formed of a high-K dielectric material such as $Si_3N_4$, TEOS, $Ta_2O_5$, $TiO_2$, $SrTiO_3$, or SiON, which are typically deposited by CVD (Chemical Vapor Deposition).

Alternately, the dielectric layer 46 can be a polymer film, including polyimide, benzocyclobutene (BCB), parylene or an epoxy-based material such as photoepoxy SU-8.

Figure 17B:
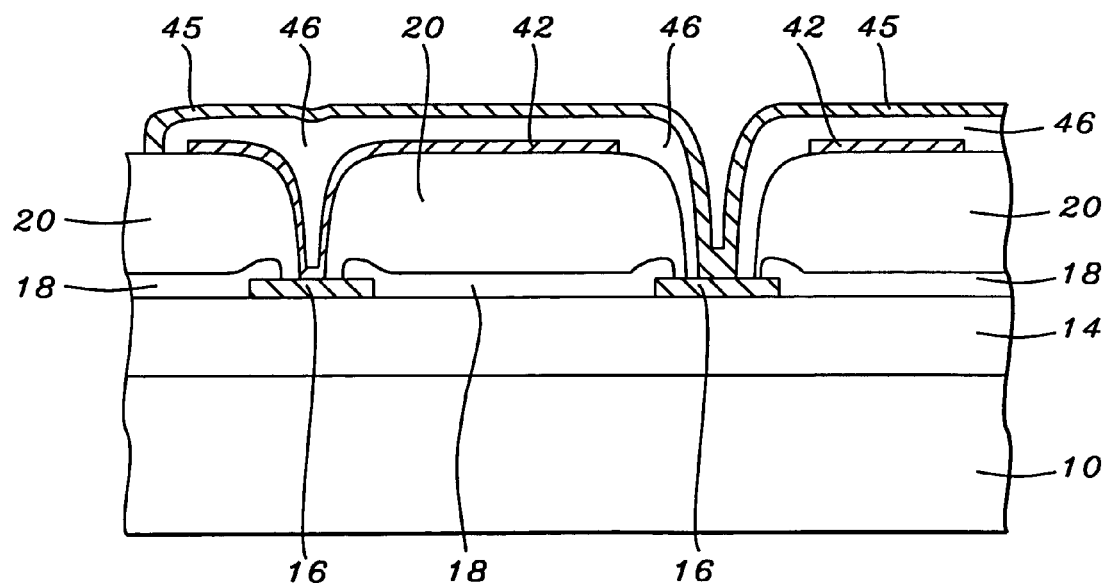
Figure 17C:
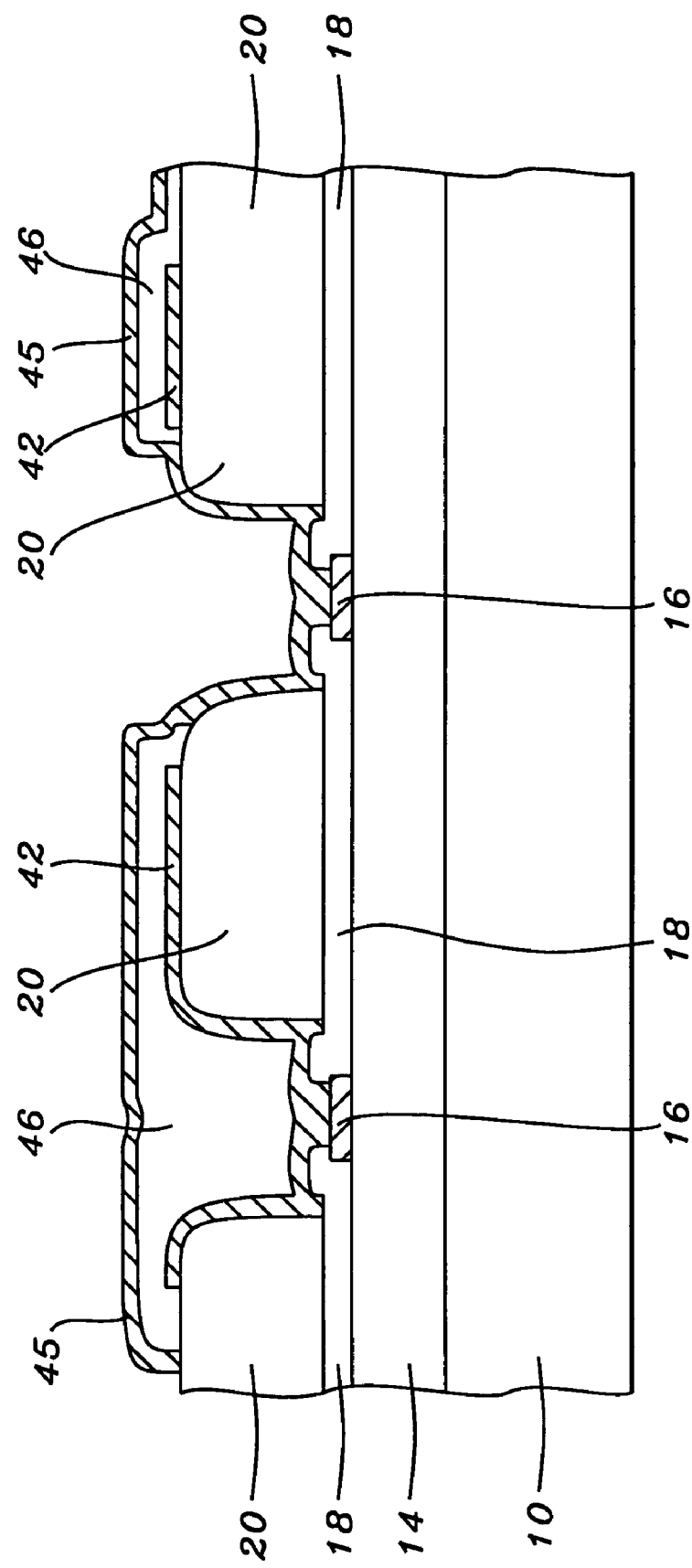

FIGS. 17b-17c show a cross section where, as in FIG. 17a, a capacitor is created. In the cross section that is shown in FIG. 17b a thick layer 20 of polymer has been deposited over the surface of the passivation layer 18 and has been patterned in order to make the contact pads 16 accessible though the thick layer 20 of polymer. FIG. 17b shows the polymer vias having a smaller via diameter than the vias created through the layer 18 of passivation. It is however preferred, as shown in FIG. 17c, that larger vias be used in conjunction with smaller passivation vias. The thick layer 20 of polymer moves most of the capacitor, that is the lower plate 42, the upper plate 45 and the dielectric 46, further from the surface of substrate 10 by a distance equal to the thickness of layer 20. It has previously been stated that the range of polyimide thickness can vary from 2 μm to 150 μm, depending on electrical design requirements. This leads to a significant increase in distance between the capacitor and underlying structures, including metal lines and/or the silicon substrate 10 so that parasitic capacitance is significantly reduced.

FIGS. 17a-17c depict both capacitor terminals being connected down to a lower layer. The capacitor may also be contacted in one-up-one-down configuration or a two-up technique.

The capacitor of FIGS. 17a-17c may optionally be covered with a protective layer of polymer, as previously described.

Figure 18:
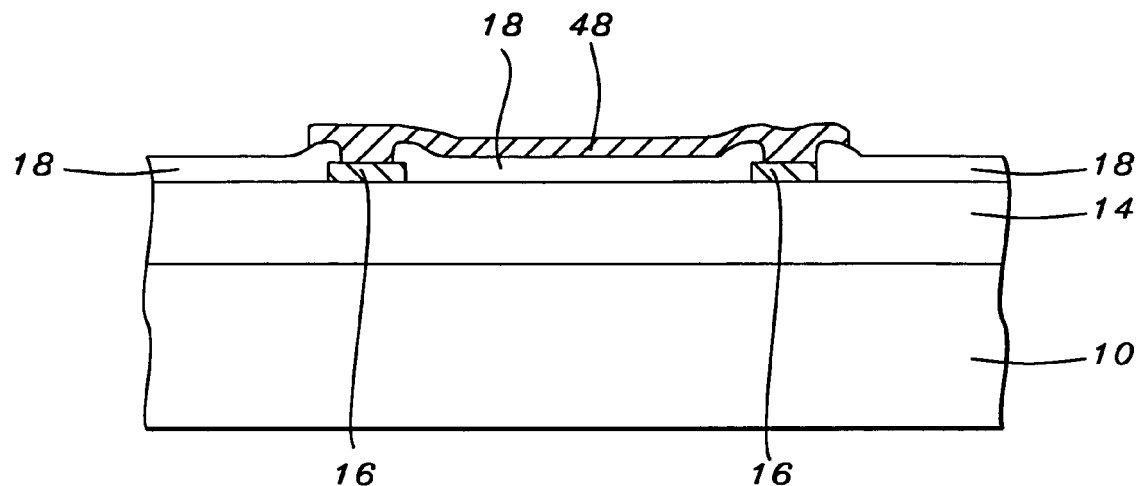
FIG. 18 is a cross sectional representation of a resistor of the invention, formed over a passivation layer.

FIG. 18 shows a cross section of a substrate 10 over which has been deposited a layer 18 of passivation, with a resistor 48 formed over passivation layer 18. A resistor 48 as is well known, is created by connecting two points with a material that offers electrical resistance to the passage of current through the material. For the creation of layer 48 a resistive material is used, such as TaN, NiCr, NiSn, tungsten (W), TiW, TiN, Cr, Ti, TaSi or Ni. Among these resistive materials, NiCr provides the best TCR (Temperature Coefficient of Resistance), which can be as small as 5 ppm/oC. Resistor 48 dimensions such as thickness, length and width of deposition of high resistive material are application dependent. The resistor 48 that is shown in cross section in FIG. 18 is, as are the capacitors of FIGS. 17a-17c, created in a post-passivation process on the surface of layer 18 of passivation.

Figure 19A:
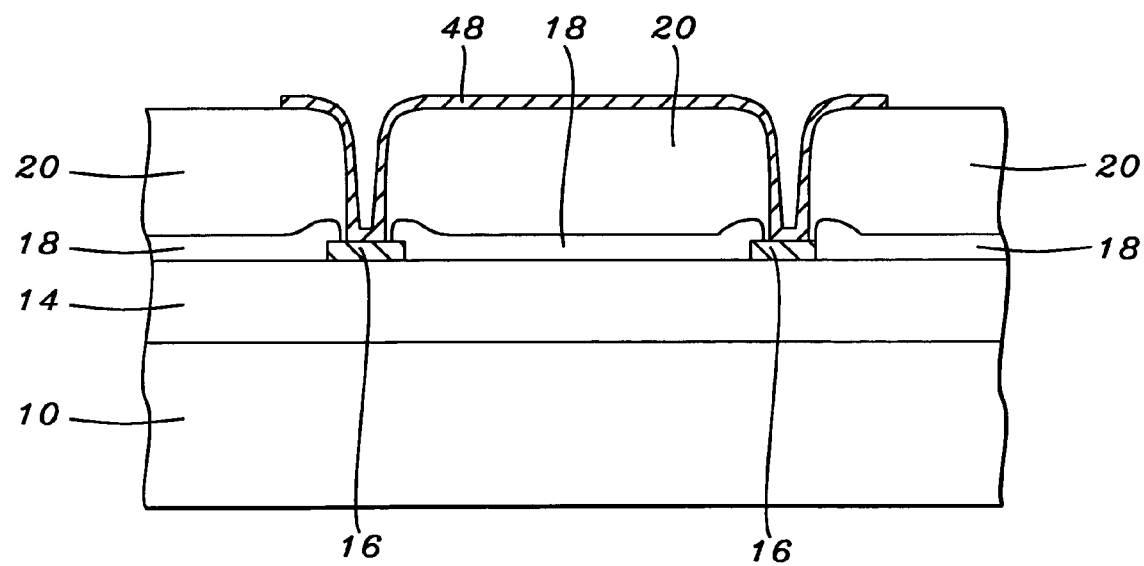
FIGS. 19a-19b are cross sectional representations of a resistor of the invention, formed over a thick polymer layer, over a passivation layer.
Figure 19B:
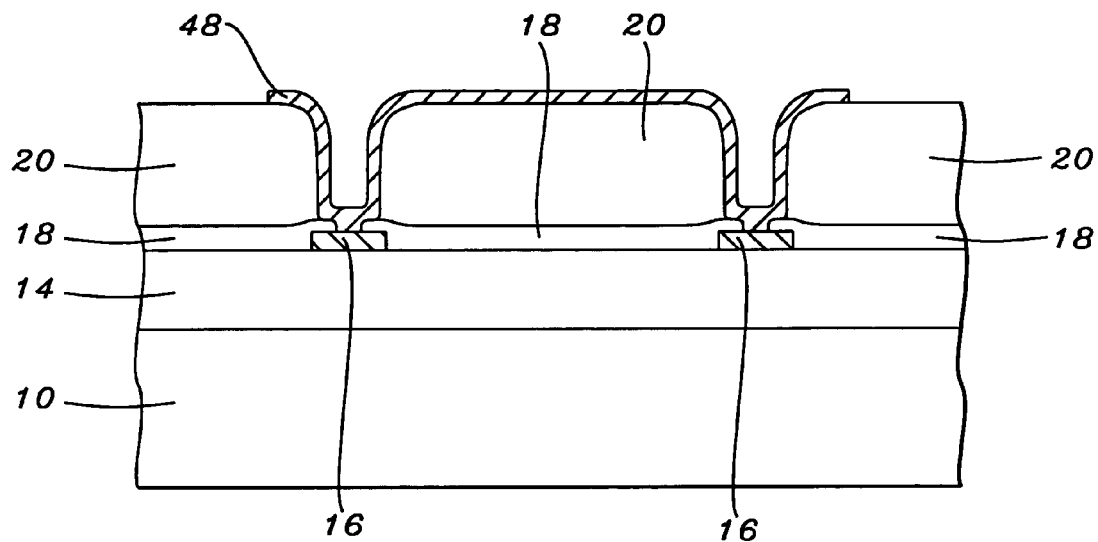

FIGS. 19a-19b shows the resistor of the invention formed over a thick layer of polymer 20, connected to contact pads 16. By increasing the distance between the body of the resistor 48 and the substrate (by the thickness of the polymer layer 20 and other intervening layers) the parasitic capacitance between the body of the resistor 48 and the substrate is reduced, resulting in an improved resistive component (reduced parasitic capacitive loss, improved high frequency performance).

FIGS. 18, 19a and 19b show a "two-down" system for contacting the terminals of the resistor 48. The resistor 48 may also be contacted in one-up-one-down configuration.

An additional layer of polymer, to protect the resistor, may optionally be formed over the resistor 48 of FIGS. 18, 19a and 19b.

Figure 20:
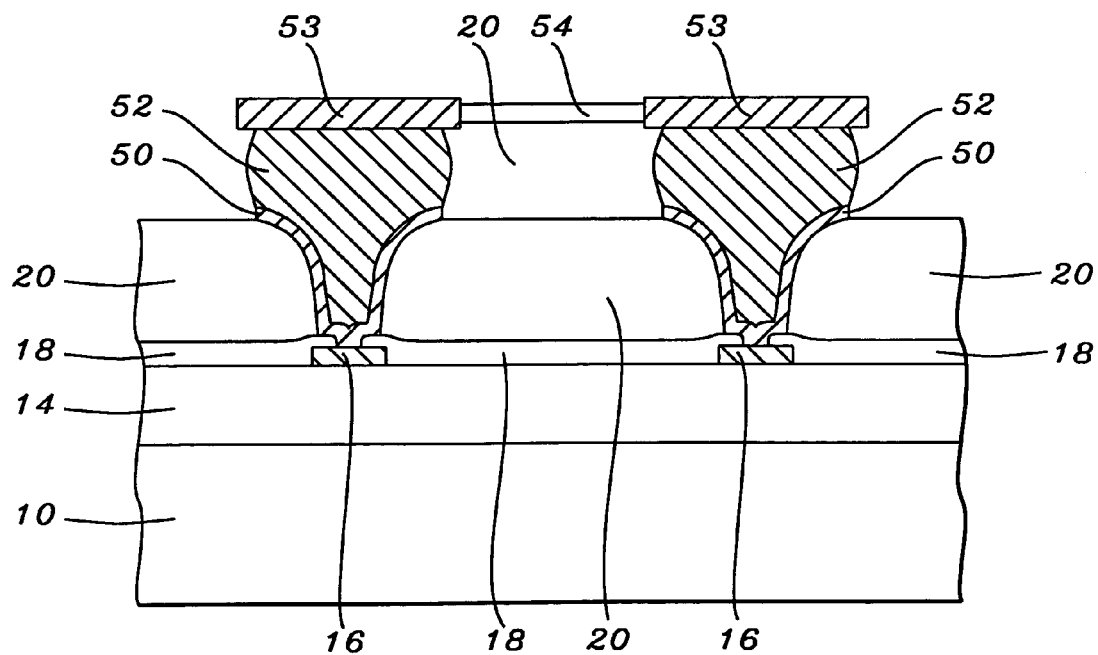
FIG. 20 is a cross sectional representation of a silicon substrate over which a discrete electrical component has been mounted, on the top of a thick polymer layer, using surface mount technology.
Figure 21:
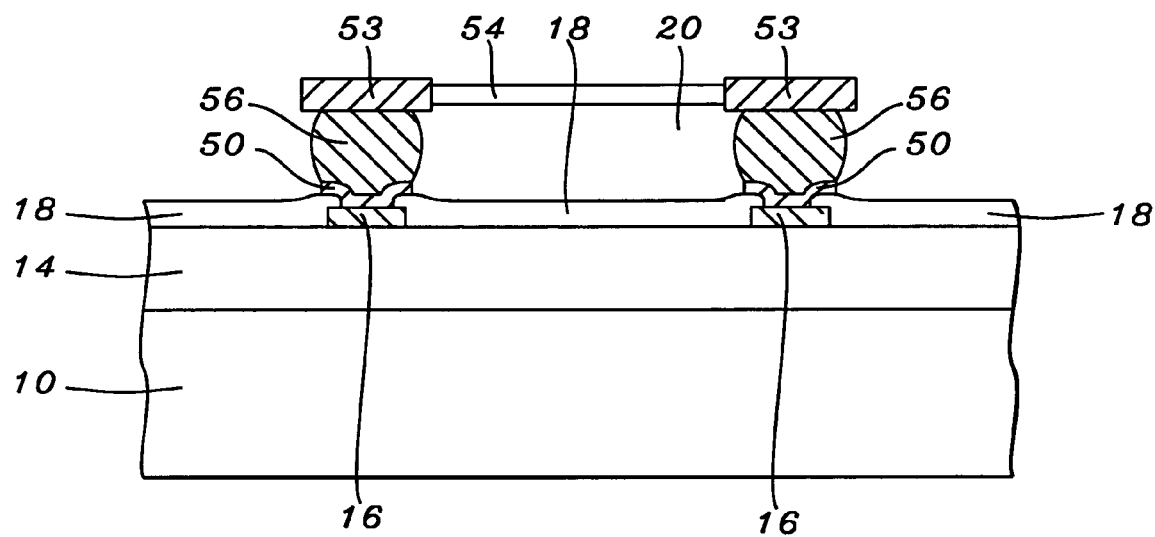
FIG. 21 is a cross sectional representation of a silicon substrate, having a passivation layer on the surface of which a discrete electrical component has been mounted, using surface mount technology.

Further applications of the post-passivation processing of the invention are shown in FIGS. 20 and 21, which concentrate on making contact points between contact pads 16 and an overlying electric component 54, such as a discrete inductor, capacitor, resistor or other passive device. Interconnect metal 50 of the invention is formed in polymer openings, as previously described, which are aligned with smaller passivation openings, to connect to pads 16, and serves as an under-bump metal (UBM) layer 50. Solder contact bumps 52 are formed over UBM layer 50 using conventional methods of solder deposition (selective plating, ball mounting, or screen printing on the surface of UBM layer 50), the application of a flux on the deposited solder and flowing the solder. A discrete device 54 is connected to solder balls 52 and has solder to facilitate the connection 53. This is similar to the surface mount technology used in the assembly of printed circuit boards. The discrete electrical component 54 may be, but is not limited to, discrete devices such as inductors, capacitors or resistors.

FIG. 21 illustrates mounting of discrete device 54, using solder bumps 56, and UBM 50, directly over passivation layer 18.

The discrete components 54 of FIGS. 20 and 21 have the advantages of performance and cost savings since the discrete component 54 does not have to be mounted on a Printed Circuit Board as is the common practice in the art.

UBM 50 is formed using the metallization scheme of the invention (as shown and described with respect to FIGS. 10-12), except that a thick layer of solder 52 (about 5 to 100 microns) is electroplated on top of Ni cap layer 106 (refer to FIG. 10), before the photoresist 94' stripping. More specifically, the UBM 50 in this case comprises Ti or Cr as the adhesion layer 100, sputtered Cu as seed layer 102, and electroplated Cu bulk layer 104 and Ni cap layer 106 as the solder diffusion barrier layer 50. If the solder layer 52 is formed by screen printing or solder ball mounting, the UBM layer 50 is prepared as follows: again following the process steps in FIGS. 10-12, except that a thin layer(not shown) of gold is electroplated on top of Ni cap layer 106 (refer to FIG. 10), before the photoresist 94' stripping. The thin layer (not shown) of gold is preferable to avoid a high gold concentration in the solder near the UBM/solder interface, after solder 52 screen printing or solder ball 52 mounting, and reflow processing. More specifically, the UBM 50 in this case comprises Ti or Cr as the adhesion layer 100, sputtered Cu as seed layer 102, electroplated Cu bulk layer 104 and Ni cap layer 106 as the solder diffusion barrier layer 50, and a thin layer of gold as the solder wettable layer.

The invention and its various features provide the advantages of:
- the discrete components provide optimized parameters and can be mounted close to the circuits, which offer true system-on-chip performance
- the discrete components mounting close to the circuits also minimizes parasitics
- the post-passivation process of the invention allows for the selection of discrete component design parameters that result in reduced resistance of the discrete capacitor and the discrete inductor, this is further clear from the following comparison between prior art processes and the processes of the invention.

Prior approaches in the art use thinner metal for inductors, requiring wider coils (to minimize resistance), resulting in increased surface area, increasing the parasitic capacitance of the inductor and causing eddy current losses in the surface of the substrate.

The present invention by contrast, can use easily formed thick metal layers, the thickness reducing resistance. Use of polymer 20 further separates the components formed from underlying structures, reducing capacitance. With the reduced capacitance, a higher frequency of operation results due to a higher resonant frequency.

Resistance of metal interconnections in an integrated circuit is determined by the material to be used and metal thickness and width, while capacitance is related to dielectric types, thickness, and metal line width, spacing, and thickness. Metal capacitance includes three components: (1) plate capacitance which is a function of the metal width to dielectric thickness aspect ratio, (2) coupling capacitance which is a function of the metal thickness to line spacing aspect ratio, and (3) fringing capacitance which is a function of metal thickness, spacing, and dielectric thickness.

In a first example, to the extreme of the fine line metal capability, fine line metal thickness is about 2 μm, fine line metal width is about 10 μm, fine line IMD thickness is about 2 μm, and the line spacing is about 10 μm. Post-passivation metal thickness is about 5 μm, metal width is about 10 μm, dielectric thickness is about 5 μm, and line spacing is also about 10 μm. The metal thickness difference results in a 2.5 times reduction in resistance in the post-passivation metal structure over the fine line metal structure. The dielectric thickness results in a 2.5 times difference in capacitance in the post-passivation metal structure over the fine line metal structure. Then, the reduction in resistance times capacitance (RC product) is 6.25 times, or about 5 times.

In a second example, fine line metal thickness is about 1 μm, fine line metal width is about 10 μm, fine line IMD thickness is about 0.5 μm, and the line spacing is about 2 μm. Post-passivation metal thickness is about 5 μm, metal width is about 10 μm, dielectric thickness is about 5 μm, and line spacing is about 10 μm. The metal thickness difference results in about a 5 times reduction in resistance in the post-passivation metal structure over the fine line metal structure. The capacitance is dominated in this case by plate capacitance with a reduction of 10 times difference in capacitance in the post-passivation metal structure over the fine line metal structure. Then, the reduction in RC product is about 50 times.

In a third example, typical capability fine line metal thickness is about 0.4 μm, fine line metal width is about 0.2 μm, fine line IMD thickness is about 0.4 μm, and the line width is about 0.2 μm. Post-passivation metal thickness is about 5 μm, metal width is about 10 μm, dielectric thickness is about 5 μm, and line width is about 10 μm. The metal thickness and width difference results in about a 625 times reduction in resistance in the post-passivation metal structure over the fine line metal structure. The capacitance is dominated by coupling capacitance and results in a 4 times difference in capacitance in the post-passivation metal structure over the fine line metal structure. Then, the reduction in RC product is 2,500 times.

In a fourth example, typical capability fine line metal thickness is about 0.4 μm, fine line metal width is about 0.2 μm, fine line IMD thickness is about 0.4 μm, and the line spacing is about 0.2 μm. Post-passivation metal thickness is about 10 μm, metal width is about 10 μm, dielectric thickness is about 10 μm, and line spacing is about 40 μm. The metal thickness difference results in about a 1250 times reduction in resistance in the post-passivation metal structure over the fine line metal structure. The capacitance is dominated by coupling capacitance and results in about an 8 times difference in capacitance in the post-passivation metal structure over the fine line metal structure. Then, the reduction in RC product is about 10,000 times.

Summarizing the above discussion, the RC product of the post-passivation metal structure can be about 5 to 10,000 times smaller than the RC product of the fine line metal structure.

It is difficult to achieve 100 times smaller RC product for the top layer metal of a fine line metallization system, when compared to the bottom layer metal in the fine line metal interconnection process. For example, the metal line resistance at the top layer metal can be reduced by designing a wide piece of metal, however, this will increase the capacitance of that metal line accordingly (because the IMD is thin). Essentially, it is hard for fine line IC metals to achieve even 10 times smaller RC product for its top metal layer versus its bottom metal layer.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A circuit component comprising:
   a silicon substrate;
   a transistor in and on said silicon substrate;
   a first dielectric layer over said silicon substrate;
   a first metal layer over said first dielectric layer;
   a second metal layer over said first dielectric layer and over said first metal layer;
   a second dielectric layer over said first dielectric layer and between said first and second metal layers wherein said second dielectric layer has a thickness between 0.1 and 1 micrometer;
   a metal trace over said first dielectric layer;
   a first contact point over said silicon substrate;
   a second contact point over said silicon substrate, wherein said first contact point is separate from said second contact point;
   a passivation layer over said metal trace, over said first and second dielectric layers and over said first and second metal layers, wherein said passivation layer comprises an oxide layer and a nitride layer;
   a polymer layer on said passivation layer, wherein said polymer layer has a thickness between 2 and 150 micrometers and greater than that of said passivation layer, wherein a first opening in said polymer layer is over said first contact point and exposes said first contact point, wherein a second opening in said polymer layer is over said second contact point and exposes said second contact point, and wherein said polymer layer comprises polyimide;

a coil on said polymer layer, wherein said coil comprises a glue/barrier layer on said polymer layer, a seed layer comprising a first copper layer having a thickness between 0.2 and 1 micrometer on said glue/barrier layer and over said polymer layer, and an electroplated metal layer comprising a second copper layer having a thickness between 3 and 20 micrometers on said first copper layer, wherein there is an undercut with an edge of said glue/barrier layer recessed from an edge of said electroplated metal layer, and wherein a first product of resistance of a first section of said coil times capacitance of said first section is smaller than a second product of resistance of a second section of said metal trace times capacitance of said second section by at least 100 times, said first section having a same length as said second section; and a metal line on said polymer layer and over said first and second contact points, wherein said first contact point is connected to said second contact point through said metal line.

2. The circuit component of claim 1, wherein said second dielectric layer comprises a silicon-based oxide.

3. The circuit component of claim 1, wherein said second dielectric layer comprises CVD silicon oxide.

4. The circuit component of claim 1, wherein said second dielectric layer comprises CVD TEOS oxide.

5. The circuit component of claim 1, wherein said second dielectric layer comprises spin-on-glass (SOG).

6. The circuit component of claim 1, wherein said second dielectric layer comprises fluorosilicate glass (FSG).

7. The circuit component of claim 1, wherein said second dielectric layer comprises high density plasma CVD oxide.

8. The circuit component of claim 1, wherein said glue/barrier layer comprises titanium.

9. The circuit component of claim 1, wherein said glue/barrier layer comprises a titanium-tungsten alloy.

10. The circuit component of claim 1, wherein said glue/barrier layer comprises titanium nitride.

11. The circuit component of claim 1, wherein said glue/barrier layer comprises tantalum nitride.

12. The circuit component of claim 1, wherein said glue/barrier layer comprises chromium.

13. The circuit component of claim 1, wherein said glue/barrier layer has a thickness between 0.02 and 0.2 micrometers.

14. The circuit component of claim 1, wherein said electroplated metal layer further comprises a nickel-containing layer on said second copper layer.

15. The circuit component of claim 14, wherein said nickel-containing layer has a thickness between 0.1 and 3 micrometers.

16. The circuit component of claim 1, wherein said coil comprises an inductor.

17. The circuit component of claim 1, wherein said first product is smaller than said second product by at least 1000 times.

18. The circuit component of claim 1, wherein said first product is smaller than said second product by at least 10,000 times.

19. A circuit component comprising:
a silicon substrate;
a transistor in and on said silicon substrate;
a first dielectric layer over said silicon substrate;
a first metal layer over said first dielectric layer;
a second metal layer over said first dielectric layer and over said first metal layer;
a second dielectric layer over said first dielectric layer and between said first and second metal layers, wherein said second dielectric layer has a thickness between 0.1 and 1 micrometer;
a metal trace over said first dielectric layer;
a passivation layer over said metal trace, over said first and second dielectric layers and over said first and second metal layers, wherein said passivation layer comprises an oxide layer and a nitride layer;
a polymer layer on said passivation layer, wherein said polymer layer has a thickness between 2 and 150 micrometers and greater than that of said passivation layer; and
a coil on said polymer layer, wherein said coil comprises a glue/barrier layer comprising titanium on said polymer layer, a seed layer comprising a first gold layer having a thickness between 0.03 and 0.3 micrometers on said glue/barrier layer and over said polymer layer, and an electroplated metal layer comprising a second gold layer having a thickness between 1 and 20 micrometers on said first gold layer, wherein an undercut with an edge of said glue/barrier layer recessed from an edge of said electroplated metal layer is between 0.1 and 1 micrometer, and wherein a first product of resistance of a first section of said coil times capacitance of said first section is smaller than a second product of resistance of a second section of said metal trace times capacitance of said second section by at least 100 times, said first section having a same length as said second section.

20. The circuit component of claim 19, wherein said polymer layer comprises polyimide.

21. The circuit component of claim 19, wherein said polymer layer comprises benzocyclobutene (BCB).

22. The circuit component of claim 19, wherein said polymer layer comprises parylene.

23. The circuit component of claim 19, wherein said polymer layer comprises an epoxy-based material.

24. The circuit component of claim 19, wherein said coil composes an inductor.

25. The circuit component of claim 19, wherein said coil composes a part of a transformer.

26. The circuit component of claim 19, wherein said second dielectric layer comprises a silicon-based oxide.

27. The circuit component of claim 19, wherein said second dielectric layer comprises CVD silicon oxide.

28. The circuit component of claim 19, wherein said second dielectric layer comprises CVD TEOS oxide.

29. The circuit component of claim 19, wherein said second dielectric layer comprises spin-on-glass (SOG).

30. The circuit component of claim 19, wherein said second dielectric layer comprises fluorosilicate glass (FSG).

31. The circuit component of claim 19, wherein said second dielectric layer comprises high density plasma CVD oxide.

32. The circuit component of claim 19, wherein said glue/barrier layer further comprises tungsten.

33. The circuit component of claim 19, wherein said glue/barrier layer further comprises nitrogen.

34. The circuit component of claim 19, wherein said glue/barrier layer has a thickness between 0.05 and 0.5 micrometers.

35. The circuit component of claim 19, wherein said first product is smaller than said second product by at least 1000 times.

36. The circuit component of claim 19, wherein said first product is smaller than said second product by at least 10,000 times.

* * * * *

UNITED STATES PATENT AND TRADEMARK OFFICE
CERTIFICATE OF CORRECTION

| | | |
|---|---|---|
| PATENT NO. | : 7,355,282 B2 | Page 1 of 1 |
| APPLICATION NO. | : 10/970871 | |
| DATED | : April 8, 2008 | |
| INVENTOR(S) | : Mou-Shiung Lin, Chien-Kang Chou and Chiu-Ming Chou | |

It is certified that error appears in the above-identified patent and that said Letters Patent is hereby corrected as shown below:

In the Terminal Disclaimer filed on February 1, 2007, line 8, the filing date of the pending Application Number 10/937,543, "10/22/04" should be changed to -- 9/9/04 --.

Signed and Sealed this

Eleventh Day of August, 2009

David J. Kappos
*Director of the United States Patent and Trademark Office*